United States Patent [19]
Paulus

[11] Patent Number: 5,626,774
[45] Date of Patent: May 6, 1997

[54] SOLDER MASK FOR MANUFACTURE OF PRINTED CIRCUIT BOARDS

[75] Inventor: James R. Paulus, La Crosse, Wis.

[73] Assignee: AlliedSignal Inc., Morristown, N.J.

[21] Appl. No.: 570,260

[22] Filed: Dec. 11, 1995

[51] Int. Cl.[6] ............................................. G03F 7/00
[52] U.S. Cl. ........................ 216/47; 216/49; 216/18; 216/20; 430/312; 430/314; 430/318
[58] Field of Search ..................... 216/43, 47, 49, 216/17, 18, 19, 20

[56] References Cited

U.S. PATENT DOCUMENTS 4,980,016  12/1990  Tada et al. .................. 156/629
5,047,114   9/1991  Frisch et al. ................. 156/630
5,334,487   8/1994  Kindl et al. .................. 430/312
5,368,884  11/1994  Yamagami et al. .......... 427/96

*Primary Examiner*—R. Bruce Breneman
*Assistant Examiner*—Michael E. Adjodha
*Attorney, Agent, or Firm*—Kyle K. Kappes; Roger Criss; Harold Wells

[57] ABSTRACT

A permanent solder mask is applied to the surface of a printed circuit board using a copper foil carrier. The solder mask preferably is one or two layers of a thermosetting resin e.g. epoxy resin. Selected circuit features are exposed by etching away portions of the copper foil and removing the underlying thermosetting resin. Then, the remaining copper foil is removed, leaving the solder mask on the surface of the printed circuit board.

6 Claims, 3 Drawing Sheets

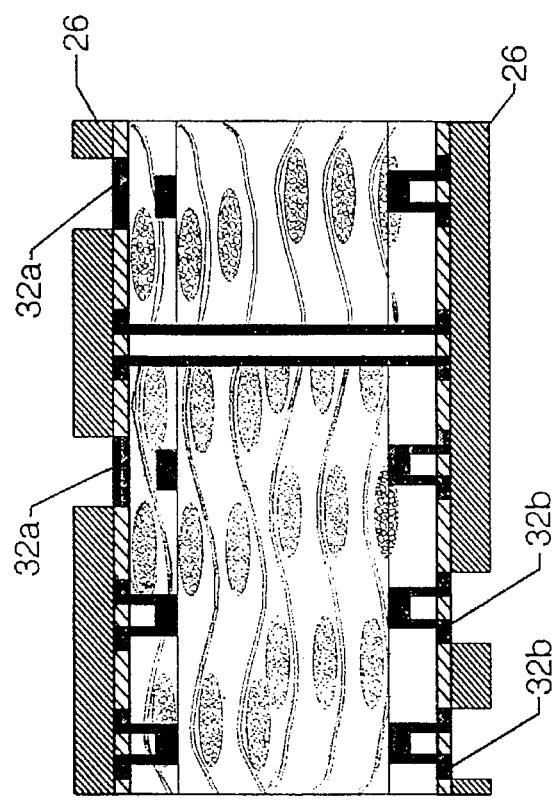
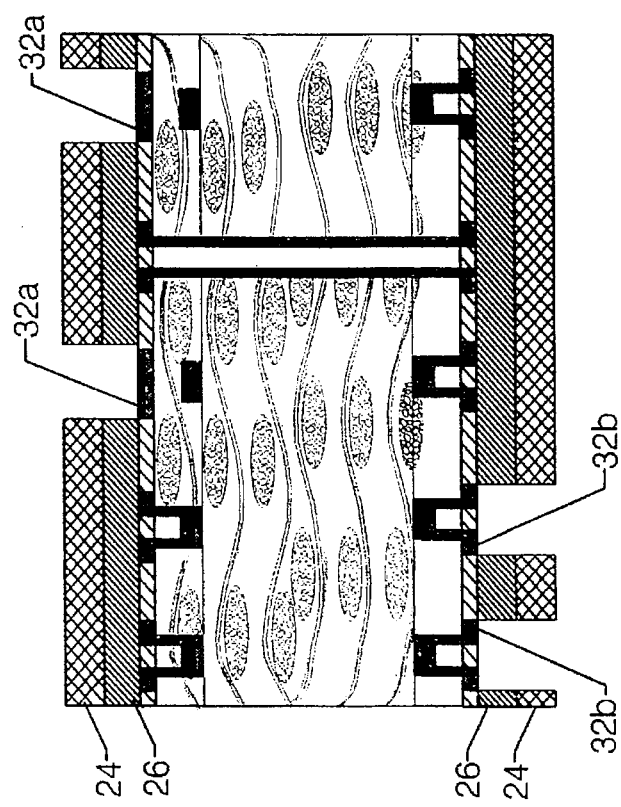

1

SOLDER MASK FOR MANUFACTURE OF PRINTED CIRCUIT BOARDS

BACKGROUND OF THE INVENTION

This invention relates to the manufacture of the printed circuit boards which are used in many electronic applications. More particularly, the invention relates to an improved solder mask for such circuit boards which employs epoxy resins or other materials having superior physical and electrical performance. The solder mask is applied by a unique method which uses a coated copper foil.

Solder mask (also called "solder resist") is defined as a coating used to protect (mask) certain areas of a primed circuit board during the soldering of connections to the circuit board. The functions of a solder resist are summarized in *Printed Circuits Handbook*, Clyde F. Coombs Jr., editor, 3rd ed. McGraw-Hill, 1988. Since the solder mask covers most of the other surfaces of the circuit board, it serves to protect the circuitry and to provide electrical insulation. Because much of the printed circuit is covered, only a small area of the circuit is exposed to solder. Therefore, less solder is used and the possibility of solder bridging over the circuit lines and other features is reduced. Also, the transfer of contaminates into the solder container from the circuit board is minimized. Finally, the solder mask reduces dendritic growth of the copper elements on the circuit board.

The present invention is directed to improved permanent solder masks, which remain on the circuit board when in use. In contrast, temporary solder masks are applied and later removed during the circuit board manufacturing process. Two general types of permanent solder masks are recognized—liquid and dry film types. Dry films are placed on the circuit board and while their performance is superior in many respects to films which are applied in liquid form, they are more expensive and, being solid films, they may not achieve full contact with both the copper circuit features and the underlying insulating substrate (e.g., a glass reinforced epoxy resin). Resists applied as liquids, such as by screen printing and the like make full contact with the circuit features and the board but they may fill holes rather than cover them and they are not as capable of precisely discriminating the circuit features to be exposed to solder. Generally, liquid films do not provide a uniform thickness and consequently, the electrical resistance also is not as uniform as would be desired.

A problem common to both types of conventional solder mask is that they generally have a low glass transition temperature (Tg) and they are not as robust as the typical epoxy resins used for the circuit boards. Also, they often are not flame resistant, so that greater amounts of flame retardents are needed in the circuit board to meet Underwriters' Laboratories standards. Ideally, conventional solder mask materials should be replaced with different materials having a higher Tg, better chemical and thermal resistance, and improved flame resistance, and which are easier to process. The inventor has sought and found an improved method of applying a solder mask, which is described below.

SUMMARY OF THE INVENTION

In one aspect, the invention is a method for forming a solder mask on the surface of a printed circuit board. A sheet of copper foil having at least one layer of partially cured (i.e. B-staged) thermosetting resin, preferably an epoxy resin, is applied to the circuitry on the surface of the printed circuit board. The resin layer fills the spaces between the circuit features and leaves a layer of resin above the circuit features which will serve as the solder mask. Then, an etch resist is applied to the surface of the copper foil and photoimaged. The uncured portions of the etch resist are removed with solvents, thus exposing certain copper areas above the locations where solder connections will be made later. The exposed copper is etched away, leaving the resin layer exposed. That resin is removed by ablation techniques such as plasma or laser to expose the copper circuit feature to which a solder connection will be made. The remaining etch resist is removed with caustics, exposing the remaining copper foil layer, which is etched away leaving the resin layer as a solder mask.

In a preferred embodiment, the copper foil is coated with fully-cured (i.e. C-staged) layer of an epoxy resin next to the copper surface and the first layer is coated with a second layer of an epoxy resin which is partially cured (i.e. B-staged). In an alternative embodiment, the copper foil has only a single layer of a resin which is capable of carrying out the functions of the two layers of epoxy resin as described.

In another aspect the invention is a solder mask for a printed circuit board which has been deposited on such a circuit board using the method described above.

BRIEF DESCRIPTION OF THE DRAWINGS

FIGS. 1–3 illustrate the method of forming a solder mask according to the invention.

FIGS. 3A and 3B illustrate the removal of the remaining copper foil, leaving a solder mask.

DETAILED DESCRIPTION OF THE INVENTION

Solder masks are layers of materials which are applied to a surface of a printed circuit board, but which expose certain circuit features to which solder connections are to be made. As previously discussed, they serve to protect the circuit during soldering operations and may remain in place permanently to protect the circuit during its use. However, present materials are inferior for permanent use and improved materials are desirable. Epoxy resins would provide the desired physical and electrical properties but their application is impractical. The present invention provides a method of applying epoxy or other thermosetting resins as solder masks. It is best described with reference to FIGS. 1–3.

Figure 1B:
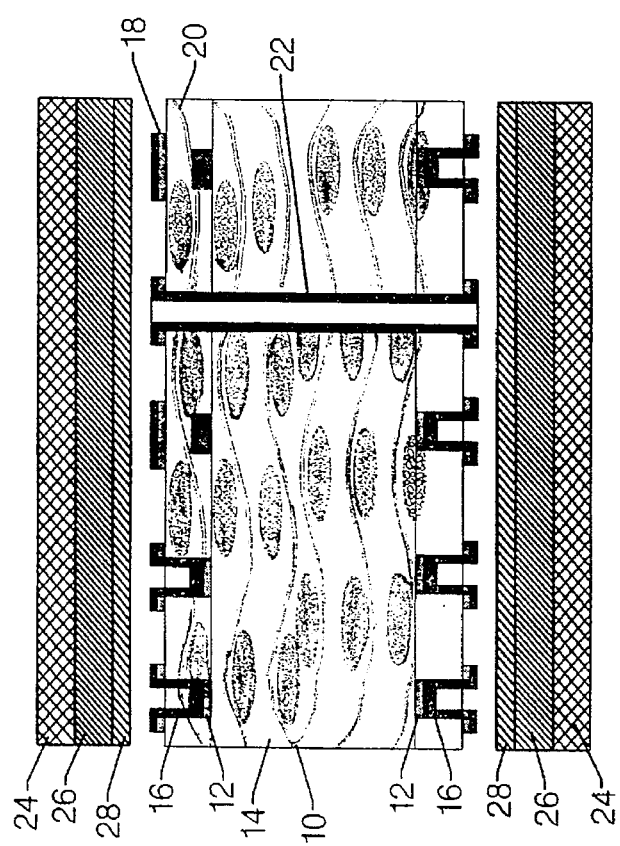
FIGS. 1A and 1B illustrate the application of a coated foil to a printed circuit board.
Figure 1A:
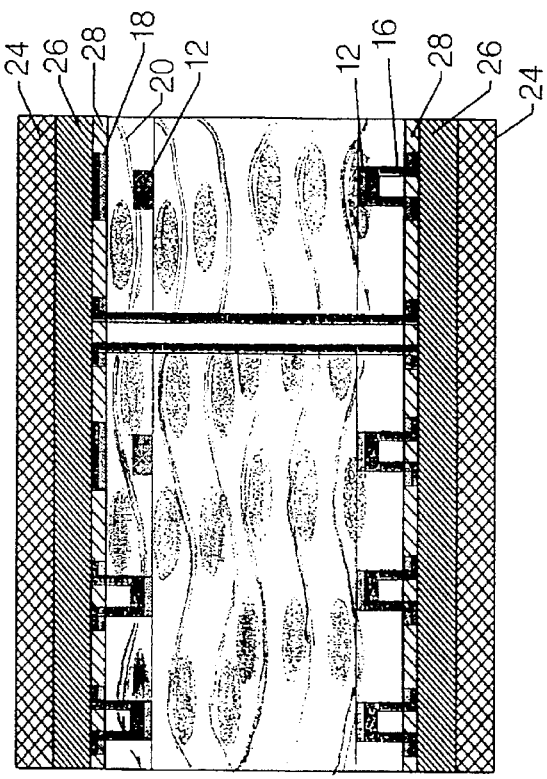

FIGS. 1A and 1B illustrate the application of a copper foil 24 coated with thermosetting resin (hereinafter referred to as the preferred epoxy resin) to the surface of a typical four layer printed circuit board 10 (PCB). The fabrication of the PCB began with the etching of circuits 12 on both sides of a glass fabric reinforced epoxy resin 14 laminated to outer layers of copper foil. These inner circuits are shown connected to a second set of circuits 18 by blind vias 16.

The second set of circuits 18 were etched from a layer of glass fiber reinforced epoxy resin 20 having a layer of copper foil on one face. The layer of glass fiber reinforced resin serves to insulate and separate the two layers of circuitry as well as serving as an adhesive between them. An electrical connection 22 through the four layer PCB between the two outer layers also is shown. In the figures the copper foil 24 is shown coated with two layers of epoxy resin 26 and 28, a preferred construction for the invention, which will be described in more detail below. The inner layer 26 preferably is substantially completely cured (C-staged) so that it serves as a uniform protective layer on the circuit board after the copper has been removed. The outer layer 28 is partially cured (B-staged) so that it remains free to flow around the raised circuit features and to serve as an adhesive. Alternatively, if a single layer of resin is used, it must serve both functions. In either case, the coated copper foil and four layer circuit board of FIG. 1A are laminated using heat and pressure, producing the laminate shown in FIG. 1B. Typically, with epoxy resins about 150° to 180° C. and 100 to 400 psig (689 to 2758 kPa gauge) will be needed.

Figure 2B:
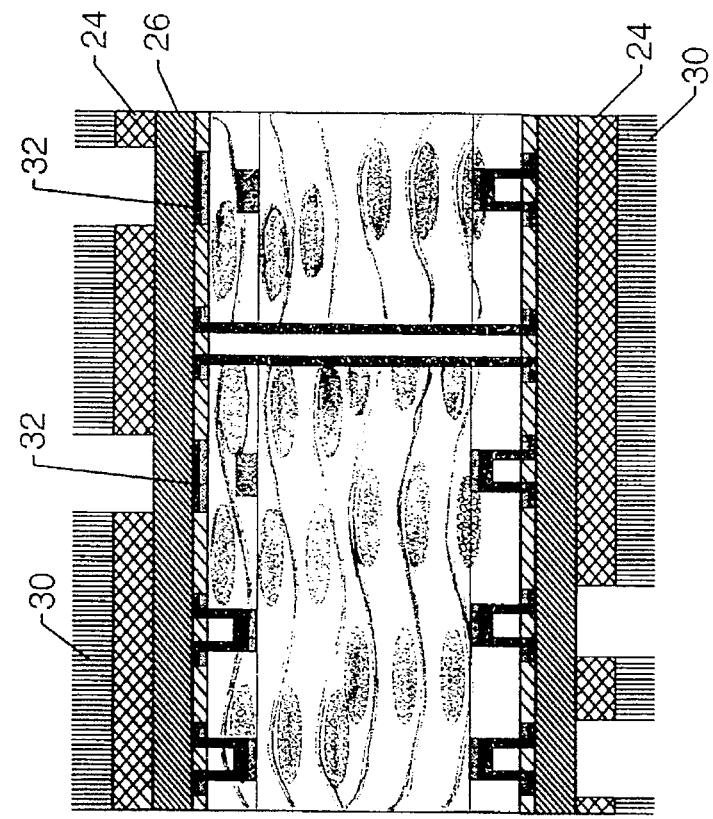
FIGS. 2A and 2B illustrate the removal of selected regions of the copper foil and resin to expose the circuit elements.
Figure 2A:
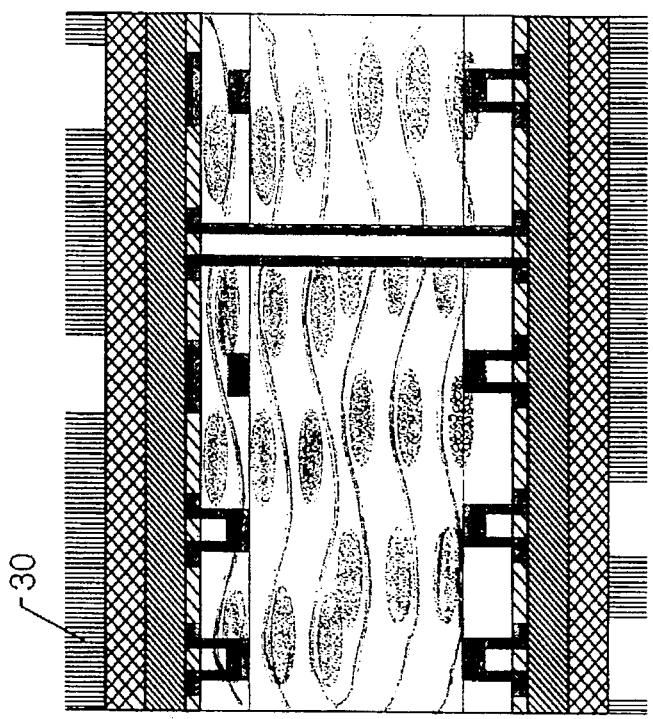

The solder mask will be layer 26. However, it is necessary to expose the desired circuit features where solder connection will be made and the residual copper foil must be removed. Access to the circuit feature is obtained by etching away the copper at the desired location as shown in FIGS. 2A and 2B. The copper foil (24) surface is covered with an etch resist layer 30. Typical materials are photoimageable adhesive films which are applied by a nip roll laminating step. The etch resist 30 is photocured using a mask which allows only the region to be accessed to remain unexposed as shown in FIG. 2A. Thus, when the unexposed (uncured) etch resist is contacted with a suitable solvent such as a sodium carbonate solution, the underlying epoxy layer 26 is exposed, while the remaining copper layer 24 is protected by the cured portion of the etch resist 30.

The underlying epoxy resin 26 can now be removed by means of plasma ablation as shown in FIG. 3A, although other methods such as UV laser or IR laser are possible. At this point in the process, the circuit features 32A and 32B which will be soldered have been exposed. It remains to remove the cured etch resist 30 (not shown in FIG. 3A) and the remaining copper foil 24. First, the etch resist is removed with suitable solvents, such as potassium hydroxide solutions as shown in FIG. 3A. Then the exposed copper 24 can be removed by etching, leaving the fully cured epoxy resin layer as a permanent solder mask on the surface of the PCB as shown in FIG. 3B. In this etching step the exposed circuit feature may be protected from the etching solution by a temporary coating, which is later removed.

Coated Copper Foil

Copper foil used in making PCB's typically is about 35 μm thick, although thinner and thicker foils are used also. Such foils are usually produced by electrodeposition from a copper solution onto a rotating metal drum. The foil is removed from the drum and treated to protect its surfaces and to improve adhesion to resin substrates.

The coating or coatings applied to the copper foil may be of various types, but preferably they will be thermosetting resins, e.g. epoxy resins since they have good electrical properties and thermal resistance. In general, the coatings should provide suitable protection against soldering as previously discussed and serve to protect the finished PCB in its normal service. In one preferred embodiment the first layer will be a fully cured (C-staged) epoxy resin, while the second layer will be a partially cured (B-staged) epoxy resin, capable of flowing under heat and pressure and of encapsulating the exposed circuit features. A single layer may be used which is capable of providing the functions of the two layer system.

Epoxy resin formulations may be selected from those used in the PCB field since they will be generally compatible with the glass fiber reinforced epoxy substrates on which the circuit features are formed. Typically, epoxy resins are combined with chain extenders, curing agents, catalysts, additives, and solvents to create an epoxy varnish which can be used to coat copper foil. Depending on the degree of curing required, the coated foil will be heated to a temperature of about 130° to 160° C. to drive off the solvents and to cause the epoxide groups to polymerize or cure. This process will be carried out twice when two layers are to be deposited on the foil, or alternatively, the second layer may be partially cured on a separate carrier sheet and later laminated to the copper foil which has been given a first coat of resin.

Alternatively, other resins may be used. Preferably, they will form thermosetting films, such as polyimide or cyanate ester resins. Another possible variation is to use a thermosetting resin for the first layer and a thermoplastic composition as the second layer since it must flow around the circuit features and serve as an adhesive.

What is claimed is:

1. A method of forming a solder mask on the surface of a printed circuit board comprising:

(a) applying to said surface a sheet of copper foil having a layer of partially cured thermosetting resin on one surface of the foil disposed so that the resin layer is between the copper foil and the circuit board surface and leaving the opposite face of the copper foil exposed;

(b) applying an etch resist over the exposed surface of the copper foil;

(c) photoimaging regions of the etch resist and removing uncured areas of the etch resist to leave copper areas exposed;

(d) etching away the copper areas exposed in (c), leaving the resin layer of (a) exposed;

(e) removing the exposed resin layer of (d) to expose a circuit feature which is to be soldered;

(f) removing the cured etch resist with a suitable solvent; and (g) etching the remaining copper foil and exposing the uncured resin as a solder mask.

2. The method of claim 1 wherein said thermosetting resin is an epoxy resin.

3. The method of claim 1 wherein said sheet of copper foil has a first layer of fully cured thermosetting resin disposed on one face of the copper foil and said partially cured thermosetting resin layer is disposed on top of said first layer.

4. The method of claim 1 wherein said sheet of copper foil has a first layer of a fully cured thermosetting resin disposed on one face of the copper foil and a thermoplastic layer disposed on top of said first layer.

5. The method of claim 1 wherein said sheet of copper foil has a single layer of a partially cured thermosetting resin disposed on one face of the copper foil.

6. A solder mask for a printed circuit board deposited on said circuit board by the method of claim 1.

* * * * *